United States Patent
Hsu et al.

(10) Patent No.: US 7,795,088 B2
(45) Date of Patent: Sep. 14, 2010

(54) METHOD FOR MANUFACTURING MEMORY CELL

(75) Inventors: Tzu-Hsuan Hsu, Hsinchu (TW);
Ming-Hsiang Hsueh, Hsinchu (TW);
Yen-Hao Shih, Hsinchu (TW);
Chia-Wei Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 542 days.

(21) Appl. No.: 11/753,850

(22) Filed: May 25, 2007

(65) Prior Publication Data

US 2008/0290397 A1    Nov. 27, 2008

(51) Int. Cl.
*H01L 21/8238* (2006.01)

(52) U.S. Cl. .................. 438/216; 438/257; 438/261; 438/268; 438/283; 438/591; 438/593; 257/324; 257/E29.309

(58) Field of Classification Search ............. 257/324, 257/E29.309; 438/216, 257, 261, 268, 283, 438/591, 593
See application file for complete search history.

(56) References Cited

U.S. PATENT DOCUMENTS

| | | | |
|---|---|---|---|
| 6,657,252 B2 * | 12/2003 | Fried et al. | 257/316 |
| 7,298,004 B2 * | 11/2007 | Specht et al. | 257/315 |
| 7,348,246 B2 * | 3/2008 | Kim et al. | 438/284 |
| 7,352,018 B2 * | 4/2008 | Specht et al. | 257/204 |
| 2005/0189582 A1 | 9/2005 | Mikolajick | |
| 2007/0018201 A1 | 1/2007 | Specht et al. | 257/204 |

(Continued)

FOREIGN PATENT DOCUMENTS

CN    1389927 A    1/2003

(Continued)

OTHER PUBLICATIONS

Jong Jin Lee et al., "Retention Reliability of FinFET SONOS Device" 44th Annual International Reliability, Physics Symposium, San Jose, 2006, pp. 530-533.

(Continued)

*Primary Examiner*—Andy Huynh
(74) *Attorney, Agent, or Firm*—J.C. Patents

(57) ABSTRACT

A method for manufacturing memory cells is provided. First, a substrate is provided, wherein a liner layer and a material layer have already been sequentially formed on the substrate. Thereafter, a patterned mask layer is formed on the substrate. Then, the patterned mask layer is trimmed. Subsequently, a portion of the material layer, a portion of the liner layer and a portion of the substrate are removed by using the patterned mask layer as a mask to define a plurality of fin-structures in the substrate. Afterward, the patterned mask layer is removed and a plurality of isolation structures among the fin structures is formed. The surface of the isolation structures is lower than that of the fin structures. Following that, charge trapping structures are formed on the substrate, covering the fin structures. Succeeding, a portion of the charge trapping structures is removed to expose the material layer. Then, the treatment process turns the material layer into a protection layer. Subsequently, a gate is formed on the substrate and straddles the protection layer, the charge trapping structures and the fin structure. Afterward, source/drain regions are formed in the fin-structure exposed by both sides of the gate.

16 Claims, 5 Drawing Sheets

U.S. PATENT DOCUMENTS

| | | | |
|---|---|---|---|
| 2007/0052010 A1 | 3/2007 | Hsu et al. | |
| 2007/0063263 A1* | 3/2007 | Oh et al. | 257/316 |
| 2008/0087942 A1* | 4/2008 | Hsu et al. | 257/324 |
| 2008/0087946 A1* | 4/2008 | Hsu et al. | 257/328 |

FOREIGN PATENT DOCUMENTS

| | | |
|---|---|---|
| CN | 1441480 A | 9/2003 |

OTHER PUBLICATIONS

Jiunn-Ren Hwang et al., "20nm Gate Bulk-FinFET SONOS Flash" 2005 iedm, International Electron Device Meeting, Washington, DC, Session 7, Sponsored by Electron Devices Society of IEEE.

Chinese First Examination Report of China Application No. 2007101611214, dated Jul.01, 2009.

* cited by examiner

METHOD FOR MANUFACTURING MEMORY CELL

BACKGROUND OF THE INVENTION

1. Field of the Invention

The present invention relates to a semiconductor device, the manufacturing method and the operating method thereof. More particularly, the present invention relates to a memory cell, the manufacturing method and the operating method thereof.

2. Description of Related Art

Along with the development of integrated circuits technology, the level of integration has to increase continuously in order to improve the device speed and functions. Take memory structure for example. When information electronic products (such as computers, mobile phones, digital cameras or personal digital assistants) are needed to process and store more and more data day by day, the storage capacities of the memory structures required by these information electronic products have to increase as well. With such conflicting demand for a larger storage capacity but a shrinking size of the memory structure, developing methods that are capable of producing a smaller memory device with a higher integration level of the device while maintaining a desirable quality of performance has been a major target for the industry.

A typical electronically erasable programmable read-only memory (EEPROM) employs a floating gate and a control gate made of doped polysilicon. When programming a memory structure, the electrons injected into the floating gate are uniformly distributed in the entire polysilicon floating gate layer. Nevertheless, as memory cells shrink, the capacitance area between the floating gate and the control gate has to shrink as well. As a result, the size of the drive current is usually insufficient to perform operations such as programming, erasing and reading.

Although the industry has developed double gate memory cells and tri-gate memory cells to overcome the above-mentioned issues and improve the electrical performance of the device. However, these types of memory cells are expensive to manufacture and the fabrication process are complex. Further, the throughput of such memory cells is low. Moreover, in tri-gate memory cells, current leakage occurs at the corners of such device, and current leakage is worsened when the device is operated under high electric field. As a result, the reliability and stability of the memory device lowers and decreasing the production yield.

SUMMARY OF THE INVENTION

The present invention provides a memory cell that makes use of the protection layer disposed on the fin structure which separates the charge trapping structures to both sides of the fin structure to prevent current leakage.

The present invention provides a method for manufacturing memory cells, which makes use of a trimming process to miniaturize the size of devices and makes use of a treatment process to form a protection layer on the fin structure to prevent current leakage.

The present invention provides a method for operating memory cells that makes use of Fowler-Nordheim (FN) tunneling to program or erase memory cells. Further, this method can also make use of the channel hot electron injection method to program memory cells and the band to -band hot hole tunneling effect to erase memory cells to access the memory cell by storing 2-bit data in a single memory cell.

The present invention provides a memory cell that is disposed on a substrate comprising a plurality of isolation structures. These isolation structures disposed in the substrate define at least one fin structure. The surface of the fin structure is higher than that of the isolation structure. The memory cell includes a gate that is disposed on the substrate and straddles the fin structure; a charge trapping structure disposed between the gate and the fin structure; a protection layer that separates the charge trapping structure that is disposed between the top of the fin structure and the gate; and the source/drain regions disposed in the fin structures on both sidewalls of the gate.

According to one embodiment of the present invention, in the memory cell, the charge trapping structure is respectively disposed on both sidewalls of the fin structure.

According to one embodiment of the present invention, in the memory cell, the protection layer is a dielectric protection layer.

According to one embodiment of the present invention, in the memory cell, the materials used for fabricating the protection layer include silicon oxide.

According to one embodiment of the present invention, in the memory cell, the surface of the protection layer is higher than that of the charge trapping structure disposed on both sidewalls of the fin structure.

In the memory cell of claim 1, the thickness of the protection layer is greater than 300 Å.

According to one embodiment of the present invention, in the memory cell, the charge trapping structures include a charge trapping layer and the material used for fabricating the charge trapping layer includes silicon nitride, aluminum oxide or other materials having high dielectric constants.

According to one embodiment of the present invention, in the memory cell, the charge trapping structure includes a tunneling dielectric layer disposed between the charge trapping layer and the fin structure.

According to one embodiment of the present invention, in the memory cell, the tunneling dielectric layer includes a bandgap engineered tunneling structure. The bandgap engineered tunneling structure is a bottom silicon oxide layer/a silicon nitride layer in the middle/a top silicon oxide layer (ONO) structure, for example.

According to one embodiment of the present invention, in the memory cell, the thickness of the bottom silicon oxide layer in the bandgap engineered tunneling structure is less than or equal to 20 Å, for example, such as between about 5~20 Å, or less than or equal to 15 Å.

According to one embodiment of the present invention, in the memory cell, the thickness of the silicon nitride layer in the bandgap engineered tunneling structure is less than or equal to 20 Å, such as between about 10~20 Å.

According to one embodiment of the present invention, in the memory cell, the thickness of the top silicon oxide layer in the bandgap engineered tunneling structure is less than or equal to 20 Å, for example, or between 15~20 Å.

According to one embodiment of the present invention, in the memory cell, the charge trapping structure includes a blocking dielectric layer disposed between the charge trapping layer and the gate.

According to one embodiment of the present invention, in the memory cell, the material used for fabricating the gate includes doped polysilicon, metal or metal silicide.

According to one embodiment of the present invention, in the memory cell, the substrate includes a bulk-Si substrate or a SOI substrate.

The present invention provides a method for manufacturing memory cells, which includes the following steps. First, a substrate is provided, wherein a liner layer and a material layer have already been sequentially formed on the substrate. Thereafter, a patterned mask layer is formed on the substrate. Then, the patterned mask layer is trimmed. Subsequently, a portion of the material layer, a portion of the liner layer and a portion of the substrate are removed by using the patterned mask layer as a mask to define a plurality of fin-structures in the substrate. Afterward, the patterned mask layer is removed and a plurality of isolation structures among the fin structures is formed. The surface of the isolation structures is lower than that of the fin structures. Following that, charge trapping structures are formed on the substrate, covering the fin structures. Succeeding, a portion of the charge trapping structures is removed to expose the material layer. Then, the treatment process turns the material layer into a protection layer. Subsequently, a gate is formed on the substrate and straddles the protection layer, the charge trapping structures and the fin structure. Afterward, source/drain regions are formed in the fin-structure exposed by both sides of the gate.

According to one embodiment of the present invention, the method for manufacturing memory cells includes removing the charge trapping structure disposed on the material layer to separate the charge trapping structures to both sidewalls of the fin structure.

According to one embodiment of the present invention, in the method for manufacturing memory cells, wherein the material layer and the charge trapping structure have different etch selectivities.

According to one embodiment of the present invention, the method for manufacturing memory cells further includes removing the charge trapping structure to expose the upper sidewalls of the material layer.

According to one embodiment of the present invention, in the method for manufacturing memory cells, the surface of the protection layer is higher than that of the charge trapping structures disposed on both sidewalls of the fin structure.

According to one embodiment of the present invention, in the method for manufacturing memory cells, the materials used for fabricating the protection layer include polysilicon.

According to one embodiment of the present invention, the method for manufacturing memory cells includes a thermal oxidation process and the materials used for fabricating the protection layer include silicon oxide.

According to one embodiment of the present invention, in the method for manufacturing memory cells, the method for forming the charge trapping structure includes sequentially forming a tunneling dielectric layer, a charge trapping layer and a blocking dielectric layer on the substrate.

According to one embodiment of the present invention, in the method for manufacturing memory cells, the tunneling dielectric layer includes a bandgap engineered tunneling structure. The bandgap engineered tunneling structure is a silicon oxide/silicon nitride/silicon oxide (ONO) structure, for example.

According to one embodiment of the present invention, in the method for manufacturing memory cells, the materials used for fabricating the charge trapping layer include silicon nitride, aluminum oxide or other materials with high dielectric constants.

According to one embodiment of the present invention, in the method for manufacturing memory cells, wherein the materials used for fabricating the patterned mask layer include silicon nitride.

According to one embodiment of the present invention, in the method for manufacturing memory cells, the trimming step includes immersing the substrate in hot phosphoric acid.

According to one embodiment of the present invention, in the method for manufacturing memory cells, the methods used for removing a portion of the material layer, a portion of the liner layer, and a portion of the substrate include a dry etching process.

According to one embodiment of the present invention, in the method for manufacturing memory cells, the method used for forming the isolation structures includes forming an isolation material layer on the substrate, which fills the gaps between the fin structures, and then removing a portion of the isolation material layer to make the surface of the isolation material layer lower than that of the fin structure.

The present invention provides a method for operating memory cells. A memory cell is disposed on a substrate having a plurality of isolation structures. At least one fin structure is defined in the substrate and the surface of the fin structure is higher than that of the isolation structures. The memory cell includes a gate disposed on the substrate and straddles the fin structures; a first doped area and a second doped area that are respectively disposed in the fin structures on both sides of the gate; two charge trapping structures that are disposed between the gate and the fin structure and respectively located on both sidewalls of the fin structure; and a protection layer disposed between the upper portion of the fin structure and the gate, separating the two charge trapping structures. The operation method includes performing a programming operation by applying a first voltage to the gate and setting the first doped region and the second doped region to a floating or ground state in order to generate sufficient voltage difference between the gate and the substrate for making the charges store in the charge trapping structures and programming the memory cell.

According to one embodiment of the present invention, in the method for operating memory cells, the scheme of the programming operation includes FN tunneling effect.

According to one embodiment of the present invention, in the method for operating memory cells, the first voltage is approximately 16 volts.

According to one embodiment of the present invention, the method for operating memory cells further includes applying a second voltage to the gate, setting the first doped region and the second doped region to a floating or ground state when performing an erasing operation in order to generate sufficient voltage difference between the gate and the substrate for earsing the charges stored in the charge trapping structures to erase memory cells.

According to one embodiment of the present invention, in the method for operating memory cells, the scheme of the erasing operation includes the F-N tunneling effect.

According to one embodiment of the present invention, in the method for operating memory cells, the second voltage is approximately −16 volts.

According to one embodiment of the present invention, in the method for operating memory cells further includes applying a third voltage to the gate, a fourth voltage to the first doped region, and a fifth voltage to the second doped region, wherein the third voltage is greater than the fifth voltage and the fifth voltage is greater than the forth voltage, to read the memory.

According to one embodiment of the present invention, in the method for operating memory cells, the third voltage is approximately 5 V, the forth voltage is approximately 0 V, and the fifth voltage is approximately 1 V.

A method for operating a memory cells is disclosed. The memory cell is disposed on a substrate having a plurality of isolation structures. The isolation structures disposed in the substrate define at least one fin structure. Further, the surface of the fin structure is higher than that of the isolation structures. The memory cell includes a gate disposed on the substrate and straddled the fin structure; a first doped region and a second doped region that are respectively disposed in the fin structure on both sides of the gate; a first charge trapping structure and a second charge trapping structure that are disposed between the gate and the fin structure, and respectively on two sidewalls of the fin structure, wherein the first charge trapping structure includes a first storage region that is adjacent to the first doped region and a second storage region that is adjacent to the second doped region, and the second charge trapping structure includes a third storage region that is adjacent to the first doped region and a fourth storage region that is adjacent to the second doped region; and a protection layer disposed between the top of the fin structure and the gate, separating the first charge trapping structure and the second charge trapping structure. The method for operating memory cells includes applying a first voltage to the gate, a second voltage to the first doped region, a third voltage to the second doped region during the programming operation, wherein the first voltage is greater than the third voltage and the third voltage is greater than the second voltage. The charges are then injected to the second storage region and the fourth storage region that are adjacent to the second doped region.

According to one embodiment of the present invention, in the method for operating memory cells, the scheme of the programming operation includes the channel hot electron injection (CHE) effect.

According to one embodiment of the present invention, in the method for operating memory cells, wherein the first voltage is approximately 10 volts, the second voltage is approximately 0 volt and the third voltage is approximately 5 volts.

According to one embodiment of the present invention, the method for operating memory cells further includes applying a fourth voltage to the gate, a fifth voltage to the first doped region, a sixth voltage to the second doped region during the erasing operation, wherein the sixth voltage is greater than the fifth voltage and the fifth voltage is greater than the fourth voltage, to erase the charges in the second storage region and the fourth storage region.

According to one embodiment of the present invention, the method for operating memory cells, scheme of the programming operation includes band to band hot hole tunneling effect.

According to one embodiment of the present invention, in the method for operating memory cells, wherein the fourth voltage is approximately −5 volts, the fifth voltage is approximately 0 volt and the sixth voltage is approximately 5 volts.

According to one embodiment of the present invention, in the method for operating memory cells, further including performing the reading operation by applying a seventh voltage to the gate, a eighth voltage to the first doped region, and a ninth voltage to the second doped region, wherein the seventh voltage is greater than the eighth voltage and the eighth voltage is greater than the ninth voltage, to read the memory.

According to one embodiment of the present invention, in the method for operating memory cells, the scheme of the reading operation comprises the reverse read method.

According to one embodiment of the present invention, in the method for operating memory cells, the seventh voltage is approximately 5 V, the eighth voltage is approximately 1.6 V, and the ninth voltage is approximately 0 V.

According to one embodiment of the present invention, the method for operating memory cells further includes applying the first voltage to the gate, the third voltage to the first doped region, the second voltage to the second doped region during the programming operation, wherein the first voltage is greater than the third voltage and the third voltage is greater than the second voltage, injecting charges into the first storage region and the third storage region that are adjacent to the first doped region.

According to one embodiment of the present invention, the method for operating memory cells, the scheme of the programming operation includes the CHEI effect.

According to one embodiment of the present invention, the method for operating memory cells further includes applying a fourth voltage to the gate, a sixth voltage to the first doped region, a fifth voltage to the second doped region during the erasing operation, wherein the sixth voltage is greater than the fifth voltage and the fifth voltage is greater than the fourth voltage, to erase the charges in the first storage region and the third storage region.

According to one embodiment of the present invention, the method for operating memory cells, the scheme of the erasing operation includes the band to band hot hole tunneling effect.

According to one embodiment of the present invention, the method for operating memory cells further includes applying a seventh voltage to the gate, a ninth voltage to the first doped region, and a eighth voltage to the second doped region, wherein the seventh voltage is greater than the eighth voltage and the eighth voltage is greater than the ninth voltage, to read the memory.

According to one embodiment of the present invention, the method for operating memory cells, the scheme of the reading operation comprises the reverse read method.

The present invention makes use of trimming process to miniaturize the patterned mask layer and to form memory cells having fin-structures in the substrate. The present invention increases the level of integration using simple and inexpensive methods. Further, the protection layer is disposed to separate the charge trapping structures to the two sidewalls of the fin structure in order to prevent current leakage at channels and enhance the electrical performance of memory cells.

In order to make the aforementioned and other objects, features and advantages of the present invention more comprehensible, preferred embodiments accompanied with figures are described in detail below.

DESCRIPTION OF EMBODIMENTS

Figure 1A:
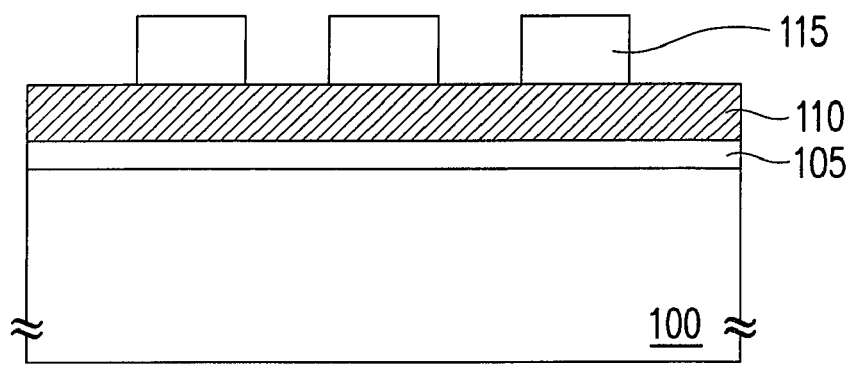
FIGS. 1A through 1G are cross-sectional views schematically illustrating the steps for manufacturing a memory cell according to one embodiment of the present invention.
Figure 1B:
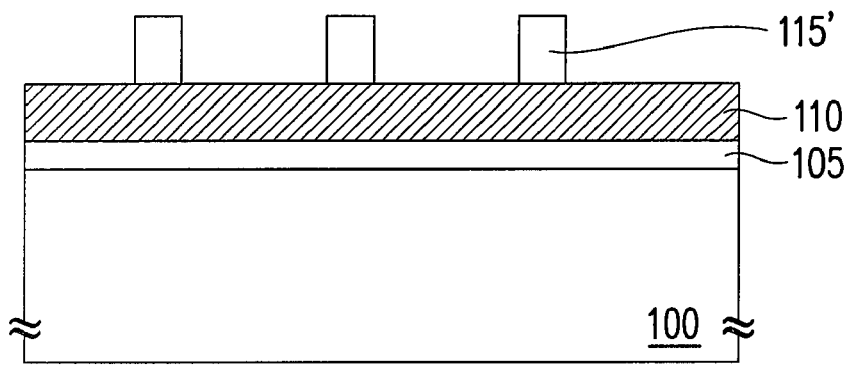
Figure 1C:
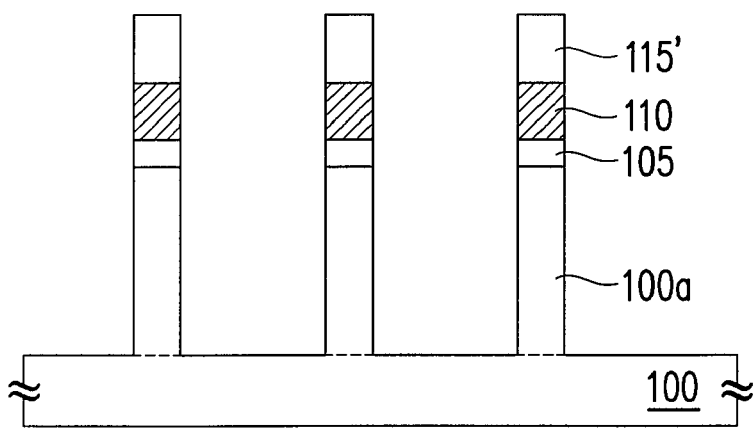
Figure 1D:
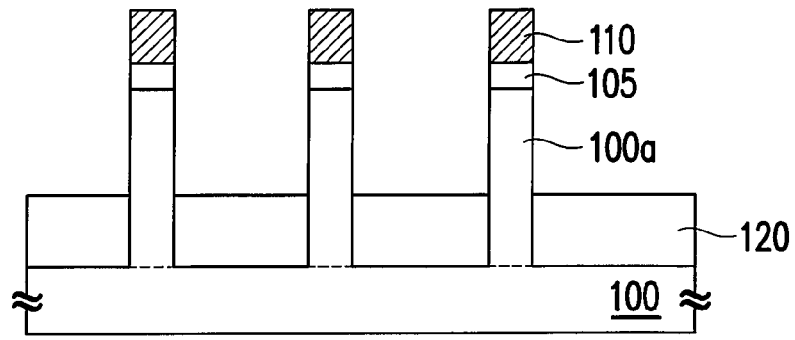
Figure 1E:
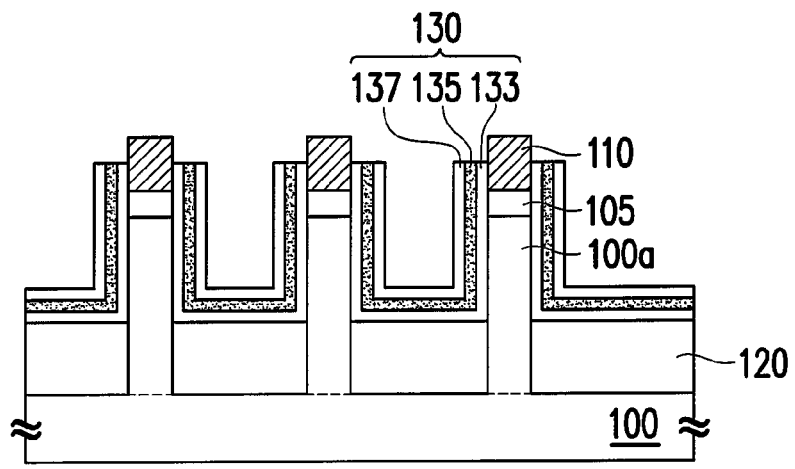
Figures 1, 1E:
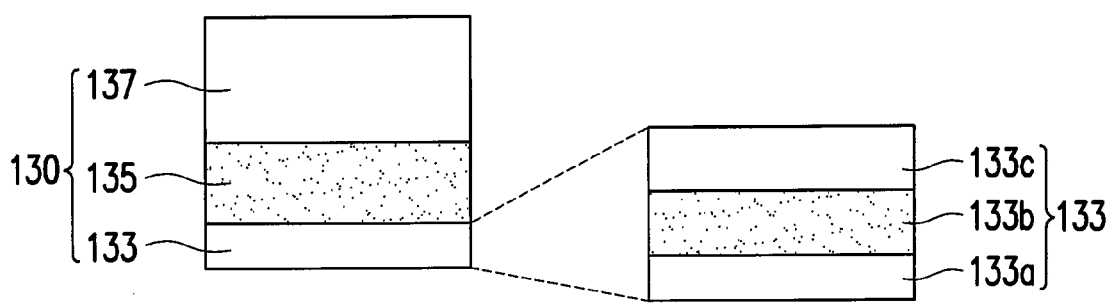

FIGS. 1A through 1 G are schematic cross-sectional views illustrating the steps for manufacturing a memory cell according to one embodiment of the present invention.

As shown in FIG. 1A, the present invention provides a method for manufacturing memory cells. First, a substrate 100 is provided. The substrate can be a bulk-Si substrate or a silicon-on-insulator (SOI) substrate. A liner layer 105 and a material layer 110 are sequentially formed on the substrate 100. The material used for fabricating the line layer 105 is, for example, silicon oxide, and the method for fabricating the same is, for example, a thermal oxidation process or a chemical vapor deposition process. The materials chosen for fabricating the material layer 110 and the charge trapping structure (130) that is subsequently formed have different etch selectivities. In one embodiment, the material used for fabricating the material layer 110 is, for example, polysilicon, and the method for fabricating the same is, for example, a chemical vapor deposition process. Then, a patterned mask layer 115 is formed on the substrate 100. The material used for fabricating the patterned mask layer 115 is, for example, silicon nitride, and the method for fabricating the same includes, for example, first forming a mask material layer (not shown) on the material layer 110 using a chemical vapor deposition process and then performing a photolithography process.

As shown in FIG. 1B, the patterned mask layer 115 is trimmed to miniaturize its size. The method for trimming the patterned mask layer 115 is, for example, a wet etching process. Specifically, the trimming process is to immerse the substrate 100 in hot phosphoric acid for a period of time to miniaturize the patterned mask layer 115 to a predetermined size. In one embodiment, the dimension of the patterned mask layer 115 after its formation by a photolithography process is, for example, 0.18 μm, and the dimension of the patterned mask layer 115' after trimming is miniaturized to 0.05 μm.

As shown in FIG. 1C, a portion of the material layer 110, a portion of the liner layer 105 and a portion of the substrate 100 are removed using the patterned mask layer 115' as a mask and a plurality of fin structures 100a are defined in the substrate 100. The method for removing portions of the aforementioned layers is, for example, a dry etching process such as a reactive ion etching process.

As shown in FIG. 1D, the patterned mask layer 115' is removed and a plurality of isolation structures 120 are formed among the fin structures 100a. Prior to removing the patterned mask layer 115', an isolation material layer (not shown) is formed on the substrate to fill the gaps between the fin structures 100a using a method such as a high density plasma chemical vapor deposition (HDP-CVD) process and the material of the isolation material layer is silicon oxide, for example, or other dielectric materials. Then, a portion of the isolation material layer is removed to expose the patterned mask layer 115'. Afterward, the patterned mask layer 115' is removed using a wet etching process or a dry etching process. Next, a portion of the isolation material layer is removed to form isolation structures 120 with a surface that is lower than that of the fin structure 100a.

In FIG. 1E, the charge trapping structure 130 is formed on the substrate 100. The charge trapping structure 130 includes a tunneling dielectric layer 133, a charge trapping layer 135 and a blocking dielectric layer 137 from the bottom to the top. Herein, the material used for fabricating the tunneling dielectric layer 133 includes dielectric material like silicon oxide, and the method for fabricating the same is, for example, a chemical vapor deposition process. Referring to FIG. 1E-1, the tunneling dielectric layer 133 also may be a bandgap engineered tunneling structure, for example, a structure stacked by a bottom silicon oxide layer 133a in the bottom/a silicon nitride layer 133b in the middle/a top silicon oxide layer 133c at the top from bottom to top, wherein the formation method of each layer may be a chemical vapor deposition process. The material used for fabricating the charge trapping layer 135 is, for example, silicon nitride, and the method for fabricating the same is, for example, a chemical vapor deposition process. The material used for fabricating the blocking dielectric layer 137 is, for example, silicon oxide, and the method for fabricating the same is, for example, a chemical vapor deposition process. Certainly, the materials used for fabricating the tunneling dielectric layer 133 and the blocking dielectric layer 137 can be other materials similar to the aforementioned. The material used for fabricating the charge trapping layer 135 is not limited to silicon nitride. Specifically, it can be other material having a high dielectric constant that is capable of trapping charges such as aluminum oxide, tantalum oxide, strontium titanate or hafnium oxide.

Next, in FIG. 1E, a portion of the charge trapping structure 130 is removed to expose the material layer 110 and separate the charge trapping structure 130 to the two sidewalls of the fin structures 100a. The method used for removing a portion of the charge trapping structure 130 is, for example, an etching back process such as a wet etching process or a dry etching process. In one embodiment, the upper portion of the charge trapping structure 130 is removed to expose the upper sidewalls of the material layer 110 to make the surface of the charge trapping structure 130 lower than that of the material layer 110.

Figure 1F:
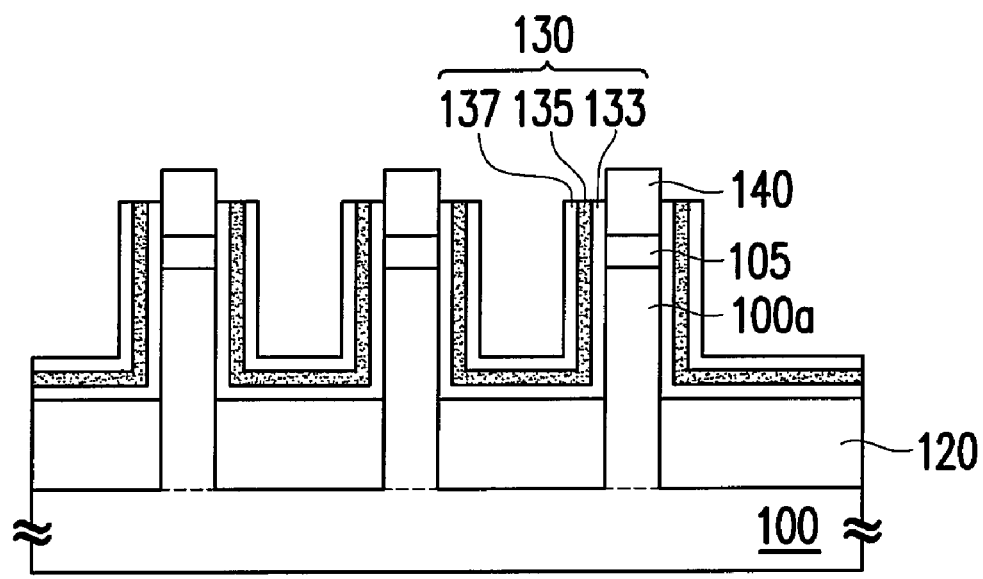

In FIG. 1F, a treatment process is performed to turn the material layer 110 into a protection layer 140. In one embodiment, the material used for fabricating the material layer 110 is, for example, polysilicon, and the treatment process is, for example, a thermal oxidation process, which oxidizes the polysilicon into silicon oxide of the protection layer 140. The thickness of the protection layer 140 is, for example, greater than 300 Å. The treatment process can be other method, including one that is being performed in the presence of nitrogen or other gases that turns the polysilicon of the material layer 110 into a dielectric material of the protection layer 140. In view of the above, removing the upper portion of the charge trapping structure 130 and forming the protection layer 140 prevent current leakage at the corners of devices during the operation of memory cells, thus enhances the stability and the reliability of memory cells.

Figure 1G:
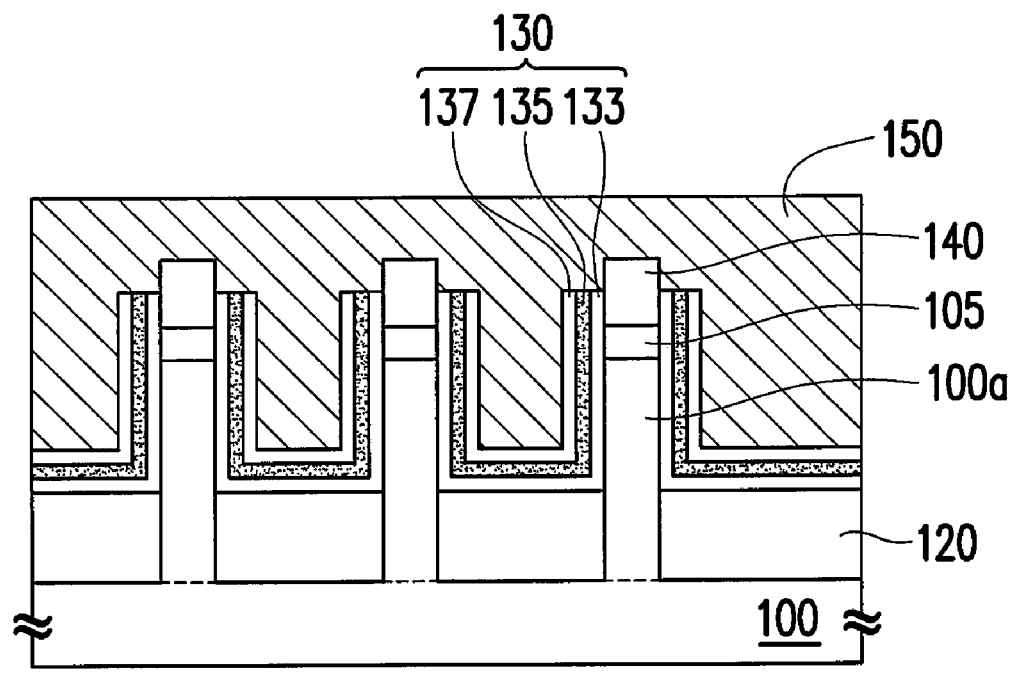

As shown in FIG. 1G, a gate 150 is formed on the substrate 100, straddling the protection layer 140, the charge trapping structure 130 and the fin structure 100a. The material used for fabricating the gate 150 is, for example, doped polysilicon, and the method for fabricating the gate 150 begins with forming a layer of doped polysilicon (not shown) and performing a photolithography process. Next, source/drain regions are formed in the fin structures 100a exposed by the two sides of gate 150 (see FIG. 2). The source/drain regions can be heavily N-doped regions or P-doped regions and the method for fabricating the same is, for example, an ion implantation process.

In the above-mentioned embodiment, a wet etching process can be used to trim the patterned mask layer 115 to overcome the limitations of photolithography, and a simple and inexpensive method is achieved to form memory cells with fin-structures to improve the integration level of devices. Further, the upper portion of the charge trapping structure 130 is removed and the protection layer 140 is formed to prevent possible current leakage at the top corners of memory cells.

Figure 2:
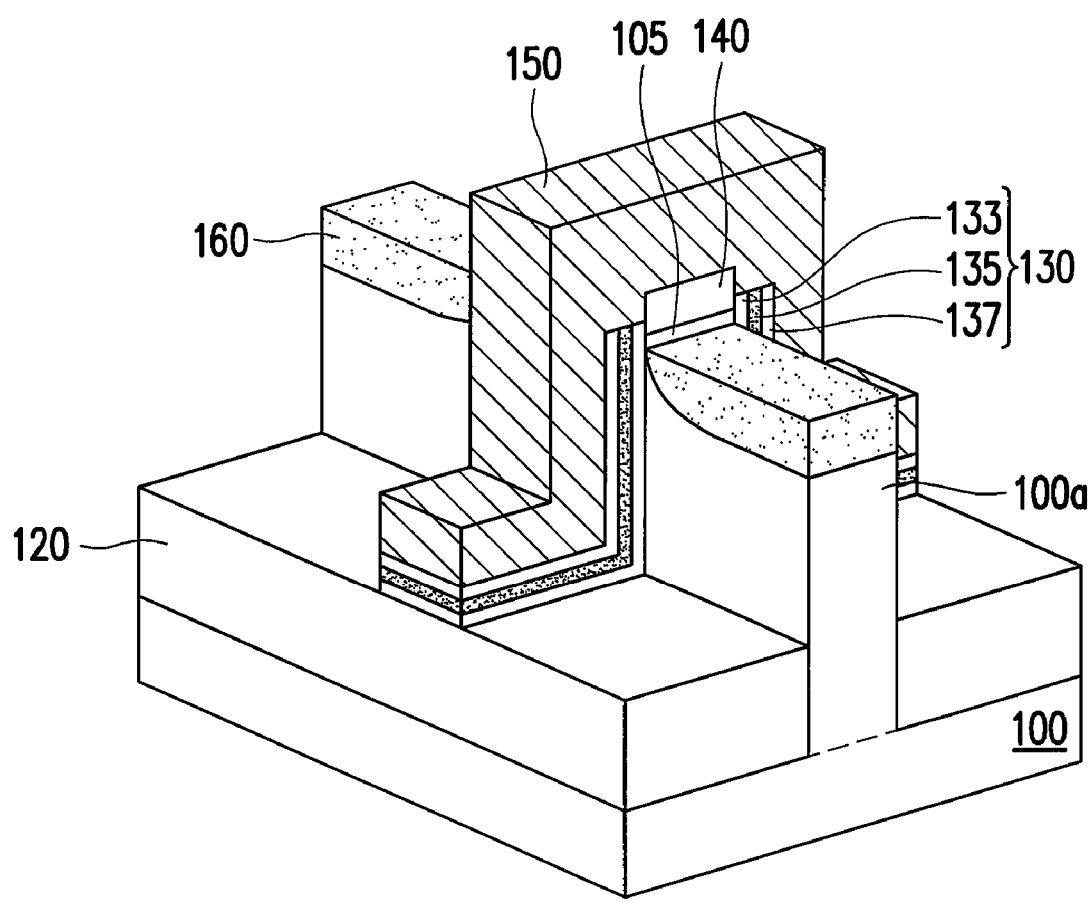
FIG. 2 is a 3-D view schematically illustrating a memory cell according to one embodiment of the present invention.

The structure of the memory cell disclosed by the present invention is described below. FIG. 2 is a schematic 3-D view illustrating a memory cell according to one embodiment of the present invention. The same elements in FIG. 2 and FIG. 1A through FIG. 1G are designated with the same reference numerals.

As shown in FIG. 2, a memory cell is disposed on a substrate 100. The substrate 100 can be a bulk-Si substrate or a silicon-on-insulator (SOI) substrate. There is a plurality of isolation structures 120 disposed on the substrate 100 and these isolation structures 120 define at least one fin structure 100a in the substrate 100. The surface of the fin structure 100a is higher than that of the isolation structure 120.

The memory cell includes a gate 150, two charge trapping structures 130, a protection layer 140 and two source/drain regions 160. The gate 150 is disposed on the substrate 100, straddling the fin structure 100a. The material used for fabricating the gate 150 is, for example, doped polysilicon, metal or metal silicide.

The charge trapping structures 130 are disposed between the gate 150 and the fin structure 100a, and, for example, respectively on both sidewalls of the fin structure 100a. The charge trapping structure 130 includes a tunneling dielectric layer 133, a charge trapping layer 135 and a blocking dielectric layer 137 that are formed adjacent to the fin structure 100a and are layered perpendicularly in the said sequence.

The material used for fabricating the tunneling dielectric layer 133 and the dielectric barrier layer 137 is, for example, silicon oxide or other similar dielectric materials. Referring to FIG. 1E-1, this figure separately show the part of the charge trapping structure 130 and the amplified graph of the tunneling dielectric layer 133. The tunneling dielectric layer 133 may be a bandgap engineered tunneling structure, for example, a structure stacked by silicon oxide/silicon nitride/silicon oxide (ONO) from bottom to top. In one embodiment, the thickness of the bottom silicon oxide layer 133a of the ONO structure is, for example, less than or equal to 20Å, between 5~20 Å, or between 10~20 Å, it also can be less than or equal to 15 Å or between 10~15 Å; the thickness of the nitride layer 133b is less than or equal to 20Å, for example, or between 10~20 Å, and the thickness of the top silicon oxide layer 133c is less than or equal to 20Å, for example, between 10~20 Å or between 15~20 Å. The material used for fabricating the charge trapping layer 135 is silicon nitride or other materials having high dielectric constants that are capable of trapping charges such as aluminum oxide, tantalum oxide, strontium titanate or hafnium oxide. In one embodiment, the thickness of the bottom silicon oxide layer 133a of the tunneling dielectric layer 133 is about 15 Å, the thickness of the silicon nitride layer 133b is about 20 Å, the top silicon oxide layer is about 20 Å, the charge trapping layer 135 is about 70 Å, the blocking layer is about 90 Å.

The protection layer 140 is disposed between the top of the fin structure 100a and the gate 150, separating the two charge trapping structures 130. The material used for fabricating the protection layer 140 is, for example, silicon oxide, silicon nitride, silicon carbide, silicon oxynitride, or silicon carbon nitride. In one embodiment, the thickness of the protection layer 140 is, for example, greater than 300 Å and the surface of the protection layer 140 is, for example, higher than that of the charge trapping structure 130, which prevents current leakage from occurring at the corners of the charge trapping structure 130 and the fin structure 100a.

The two source/drain regions 160 are respectively disposed in the fin structure 100a on both sides of the gate 150. The source/drain regions 160 may be P-doped regions that are doped with P-type dopants such as boron and boron difluoride ($BF_2$) or N-doped regions that are doped with N-type dopants such as phosphorous or arsenic.

Since the protection layer 140 divides the charge trapping structure 130 into two areas which are respectively disposed on both sidewalls of the fin structure 100a. Hence, the generation of abnormal electric field at the corners of the charge trapping structure 130 that leads to the opening of the upper channel can be prevented when operating memory cells. As a result, the stability and the reliability of memory cells are ensured, enhancing the electrical performance of the device.

Figure 3A:
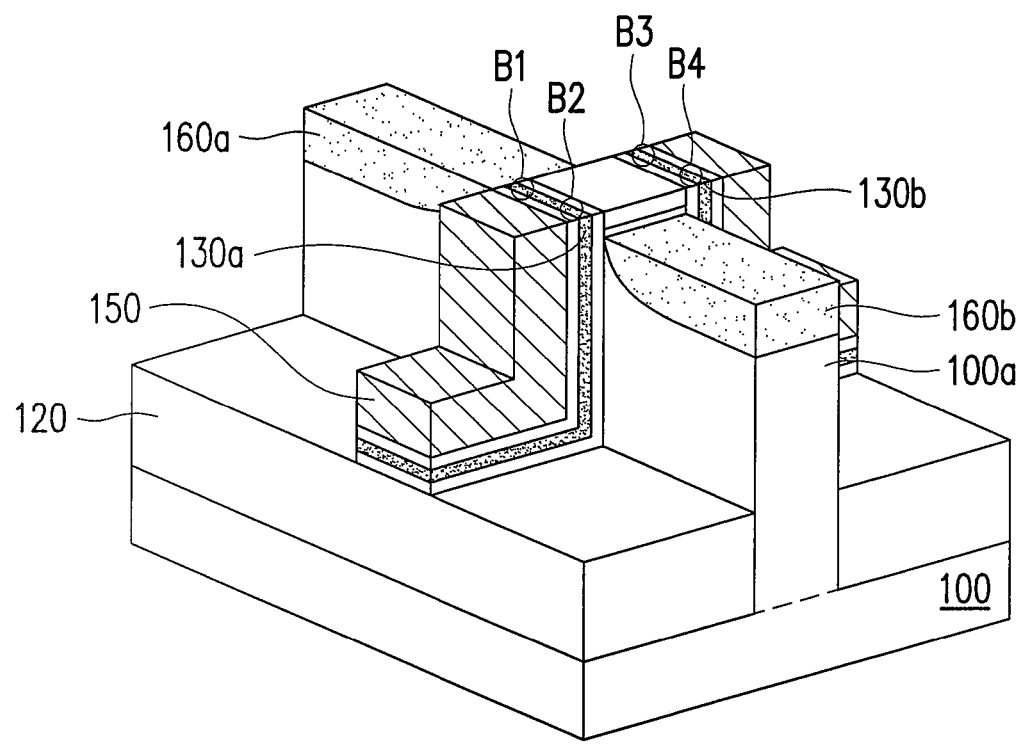
FIG. 3A is a 3-D cross-sectional view schematically illustrating a memory cell according to one embodiment of the present invention.
Figure 3B:
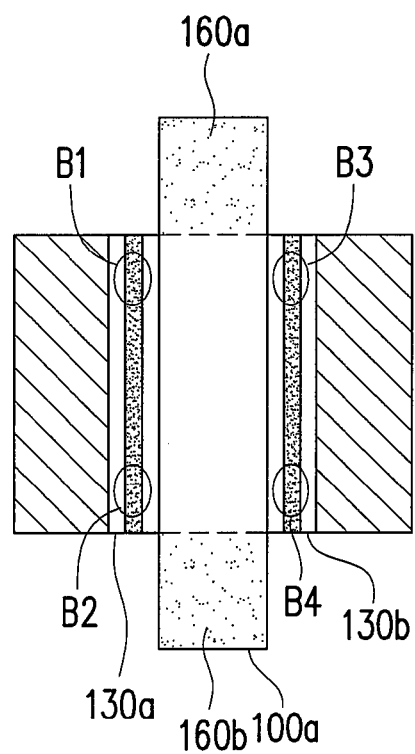
FIG. 3B is a top view of the memory cell shown in FIG. 3A.

The method for operating the memory cell provided by the present invention is described below. FIG. 3A is a schematic 3-D view illustrating a memory cell according to one embodiment of the present invention. FIG. 3B is a top view of the memory cell shown in FIG. 3A. The same elements in FIG. 2, FIG. 3A and FIG. 3B are designated with the same reference numerals and the description thereof is omitted.

Please refer to FIG. 3A and FIG. 3B. To clearly illustrate the region on the charge trapping structure 130 where charges are stored during the operation, FIG. 3A shows the top cross-sectional view of the charge trapping structure 130. However, the portion of the gate 150 that is disposed over the charge trapping structure 130 and a portion of the protection layer 140 are omitted from the drawing. Additionally, the charge trapping structures 130 disposed on both sides of the fin structure 100a are respectively represented by a first charge trapping structure 130a and a second charge trapping structure 130b. The source/drain regions 160 are respectively represented by a first doped region 160a and a second doped region 160b. Herein, the first charge trapping structure 130a includes a first storage region B1 that is adjacent to the first doped region 160a and a second storage region B2 that is adjacent to the second doped region 160b. The second charge trapping structure 130b includes a third storage region B3 that is adjacent to the first doped region 160a and a fourth storage region B4 that is adjacent to the second doped region 160b.

In one embodiment, when programming a memory cell, the sufficient amount of voltage applied to the gate 150 is, for example, approximately 16 volts and the first doped region 160a and the second doped region 160b are set to a floating or ground state, which generates sufficient voltage difference between the gate 150 and the fin structure 100a of the substrate 100 for making the charges store in the charge trapping structures 130a and 130b to program the memory cell. The scheme of the programming operation is the FN tunneling effect, for example.

When erasing the memory cell, the amount of voltage applied to the gate 150 is, for example, approximately −16 volts and the first doped region 160a and the second doped region 160b are set to a floating or ground state, which generates sufficient voltage difference between the gate 150 and the fin structure 100a of the substrate 100 for injecting charges into the substrate 100 from the charge trapping structures 130a and 130b to erase the charges stored in the charge trapping structures 130a and 130b. For example, the holes are injected into, or the electrons are removed from the charge trapping structures 130a and 130b to erase the memory cell. The scheme of the erasing operation may be the F-N tunneling effect.

When reading the memory cell, applying a voltage Vg to the gate 150, a voltage Vs to the first doped region 160a, and a voltage Vd to the second doped region 160b, wherein the voltage Vg is greater than the voltage Vd and the voltage Vd is greater than the voltage Vs, to read the memory. In one embodiment, the voltage Vg is about 5 V, the voltage Vs is about 0 V, and the voltage Vd is about 1V.

According to one embodiment of the present invention, in the method for operating memory cells, the third voltage is approximately 5 V, the forth voltage is approximately 0 V, and the fifth voltage is approximately 1 V.

In another embodiment, when programming the memory cell, a first voltage is applied to the gate 150, a second voltage is applied to the first doped region 160a, a third voltage is applied to the second doped region 160b, wherein the first voltage is greater than the third voltage and the third voltage is greater than the second voltage, injecting charges into the second storage region B2 and the fourth storage region B4 that are adjacent to the second doped region 160b. The first voltage is, for example, approximately 10 volts. The second voltage is, for example, approximately 0 volt. The third voltage is, for example, approximately 5 volts. The scheme of the programming operation is the channel hot electron injection (CHEI) effect, for example.

When performing an erasing operation, a fourth voltage is applied to the gate 150, a fifth voltage is applied to the first doped region 160a, a sixth voltage is applied to the second doped region 160b, wherein the sixth voltage is greater than the fifth voltage and the fifth voltage is greater than the fourth voltage, erasing the charges in the second storage region B2 and the fourth storage region B4. The fourth voltage is, for example, approximately −5 volts. The fifth voltage is, for example, approximately 0 volt. The sixth voltage is, for example, approximately 5 volts. The scheme of the erasing operation is the band to band hot hole tunneling effect, for example.

When performing a reading operation, a reverse read is, for example, operated by applying a reverse bias in a direction that is opposite to the direction of programming to read the charge storage state in the second storage region B2 and the fourth storage region B4. In one embodiment, a seventh voltage is applied to the gate 150, an eighth voltage is applied to the first doped region 160a, a ninth voltage is applied to the second doped region 160b, wherein the seventh voltage is greater than the eighth voltage and the eighth voltage is greater than the ninth voltage, to read the charges in the second storage region B2 and the fourth storage region B4. The seventh voltage is, for example, approximately 5 volts. The eighth voltage is, for example, approximately 1.6 volt. The ninth voltage is, for example, approximately 0 volts.

Certainly, when performing the programming operation, the first voltage can be applied to the gate 150, the second voltage that was originally applied to the first doped region 160a can be applied to the second doped region 160b, and the third voltage that was originally applied to the second doped region 160b can be applied to the first doped region 160a. Herein, the first voltage is greater than the third voltage and the third voltage is greater than the second voltage. Charges are injected into the first storage region B1 and the third storage region B3 that are adjacent to the first doped region 160a. The first voltage is, for example, approximately 10 volts. The second voltage is, for example, approximately 0 volt. The third voltage is, for example, approximately 5 volts. The scheme of the programming operation is the channel hot electron injection effect, for example.

When the charges in the first storage region B1 and the third storage region B3 are erased, the fourth voltage can be applied to the gate 150. The above-mentioned sixth voltage can be applied to the first doped region 160a and the above-mentioned fifth voltage can be applied to the second doped region 160b. Herein, the sixth voltage is greater than the fifth voltage and the fifth voltage is greater than the fourth voltage. The charges in the first storage region B1 and the third storage region B3 are erased. The fourth voltage is, for example, approximately −5 volts. The fifth voltage is, for example, approximately 0 volt. The sixth voltage is, for example, approximately 5 volts. The scheme of the erasing operation is the band to band hot hole tunneling effect, for example.

Similarly, the charge storage state of the first storage region B1 and the third storage region B3 can be read by a reverse read and by applying the seventh voltage to the gate 150, the above-mentioned ninth voltage to the first doped region 160a, and the above-mentioned eighth voltage to the doped region 160b. The seventh voltage is greater than the eighth voltage and the eighth voltage is greater than the ninth voltage, to read the charges in the first storage region B1 and the third storage region B3. The seventh voltage is, for example, approximately 5 volts. The eighth voltage is, for example, approximately 1.6 volt. The ninth voltage is, for example, approximately 0 volts.

In other words, the above-mentioned memory cell can be a memory cell that accesses a 1-bit data to program and erase through the F-N tunneling effect. On the other hand, the above-mentioned memory cell can be a memory cell that accesses a 2-bit data, programs through hot electron injection effect and erases through the band to band hot hole tunneling effect, varying according to the desired needs and design of the device. Further, since there is no charge trapping structure disposed on the protection layer, the charge trapping structures are respectively formed on both sides of the fin structure, which ensures no current leakage at the corners of the device during operation.

Accordingly, the present invention provides a memory cell that makes use of a trimming process to miniaturize the patterned mask layer. The present invention overcomes the limitations of photolithography and can precisely control the feature size of the subsequently formed fin structure, which are beneficial to the integration level of the device and prevents the short channel effect. Further, the method provided by the present invention is a simple method that is easy to control and offers low manufacturing costs.

Moreover, a protection layer is disposed on the fin structure, separating the charge trapping structure to both sides of the fin structure and thereby preventing current leakage at the top corners of the fin structure and improving the electrical performance of the memory cell during operation.

It be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a memory cell comprising the steps of:
   providing a substrate having a liner layer and a material layer sequentially formed thereon;
   forming a patterned mask layer on the substrate;
   trimming the patterned mask layer;
   removing a portion of the material layer, a portion of the liner layer and a portion of the substrate to define a plurality of fin structures in the substrate by using the patterned mask layer as a mask;
   removing the patterned mask layer;
   forming a plurality of isolation structures among the fin structures and a surface of the isolation structures is lower than a surface of the fin structures;
   forming a charge trapping structure on the substrate, covering the fin structures;
   removing a portion of the charge trapping structure to expose the material layer;
   performing a treatment process to turn the material layer into a protection layer;
   forming a gate on the substrate and over the protection layer, the charge trapping structure, and the fin structure; and
   forming a source/drain region in the fin structure exposed by both sides of the gate.

2. The method of claim 1, wherein the charge trapping structure on the material layer is removed to separate the charge trapping structures to both sidewalls of the fin structure.

3. The method of claim 1, wherein the material layer and the charge trapping structure have different etch selectivities.

4. The method of claim 3, further comprising removing the charge trapping structure to expose the upper sidewalls of the material layer.

5. The method of claim 1, wherein a surface of the protection layer is higher than a surfaces of the two charge trapping structures disposed on both sides of the fin structure.

6. The method of claim 1, wherein the material used for fabricating the material layer comprises polysilicon.

7. The method of claim 6, wherein the treatment process comprises a thermal oxidation process and the material used for fabricating the protection layer comprises silicon oxide.

8. The method of claim 1, wherein the method for fabricating the charge trapping structure comprises sequentially forming a tunneling dielectric layer, a charge trapping layer and a blocking dielectric layer on the substrate.

9. The method of claim 8, wherein the tunneling dielectric layer comprises a bandgap engineered tunneling structure.

10. The method of claim 9, wherein the bandgap engineered tunneling structure comprises a silicon oxide/ silicon nitride/ silicon oxide (ONO) structure.

11. The method of claim 8, wherein the material used for fabricating the charge trapping layer comprises silicon nitride, aluminum oxide or other materials with high dielectric constants.

12. The method of claim 1, wherein the material used for fabricating the patterned mask layer comprises silicon nitride.

13. The method of claim 12, wherein the trimming process comprises immersing the substrate in hot phosphoric acid.

14. The method of claim 1, wherein the method used for removing a portion of the material layer, a portion of the line layer, and a portion of the substrate comprises a dry etching process.

15. The method of claim 1, wherein the method for forming the isolation structures comprises:
    forming an isolation material layer on the substrate to fill a plurality of gaps among the fin structures; and
    removing a portion of the isolation material layer to make the surface of the isolation material layer lower than the surface of the fin structure.

16. The method of claim 1, wherein the substrate comprises a bulk-Si substrate or a SOI substrate.

* * * * *